United States Patent [19]

Schroeder

[11] 3,972,003
[45] July 27, 1976

[54] HIGH SPEED CURRENT DETECTION AMPLIFIER CIRCUIT

[75] Inventor: Paul Robert Schroeder, Wescosville, Pa.

[73] Assignee: Bell Telephone Laboratories, Incorporated, Murray Hill, N.J.

[22] Filed: Aug. 9, 1974

[21] Appl. No.: 496,147

[52] U.S. Cl. .............................. 330/30 D; 330/22; 330/69
[51] Int. Cl.² .......................................... H03F 3/45
[58] Field of Search ............ 307/235; 330/22, 30 D, 330/69

[56] References Cited
UNITED STATES PATENTS

| | | | |
|---|---|---|---|
| 3,434,069 | 3/1969 | Jones | 330/30 D |
| 3,573,491 | 4/1971 | Goss et al. | 330/30 D X |
| 3,573,495 | 4/1971 | Xylander | 330/30 D |

*Primary Examiner*—R. V. Rollnec
*Assistant Examiner*—Lawrence J. Dahl
*Attorney, Agent, or Firm*—I Ostroff

[57] ABSTRACT

A relatively high sensitivity and high speed current detector consists of essentially a common base differential amplifier consistng of two junction transistors, each having separate emitter and collector resistors, and a constant current source connected to the collector resistors. Separate input terminals connected to the emitters allow complementary information current signals or an information current signal and a reference current signal to be applied to the emitter terminals. The output signal and the complement thereof appear at their respective collectors.

5 Claims, 2 Drawing Figures

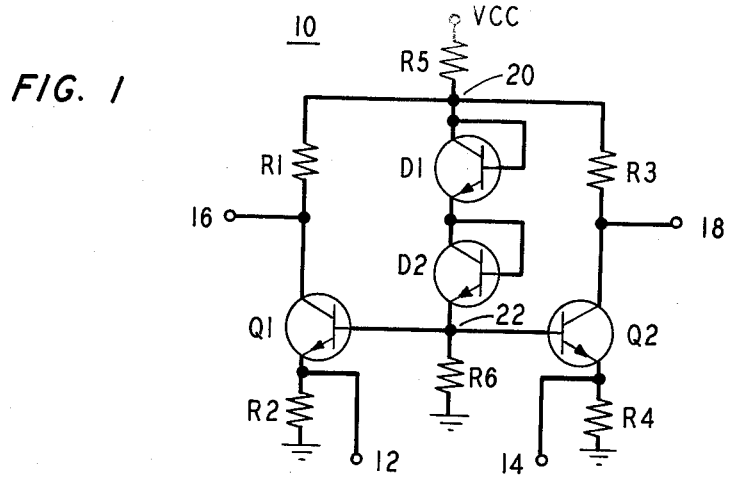
FIG. 1
FIG. 2
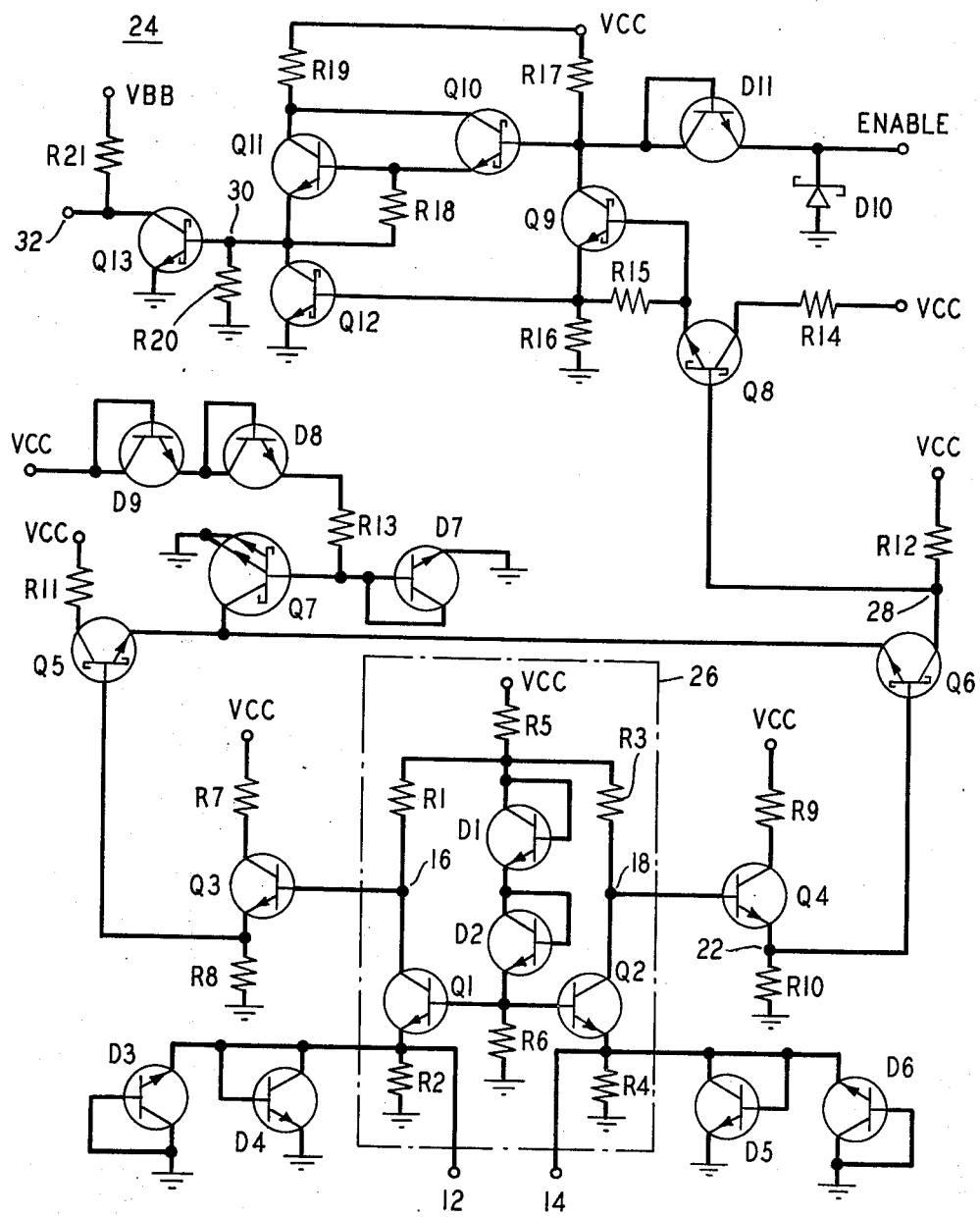

HIGH SPEED CURRENT DETECTION AMPLIFIER CIRCUIT

BACKGROUND OF THE INVENTION

This invention relates to amplifier circuits and, in particular, to detection amplifiers used to detect information readout from dynamic semiconductor memory array systems.

Many of today's detection amplifiers, such as the common emitter differential amplifier, employ voltage sensing techniques. Typically, a voltage signal is applied to the base input terminal while the complement signal, or a reference signal, is applied to the other base input terminal. This circuit has the nominal advantage of having relatively high input impedance which does not load down the source of the input signals.

In many of today's dynamic MOS memory array systems, the output signals are pulses of charge or relatively low current levels. The high input impedance of common emitter differential amplifier coupled with the relatively large capacitance associated with the output bit lines of these memories results in a relatively large RC time constant which degrades the response time of the amplifier.

SUMMARY OF THE INVENTION

The present invention is an amplifier detector circuit which comprises in an illustrated embodiment thereof a pair of junction transistors with a separate resistor being coupled to the emitter and collector of each transistor. A separate input terminal is coupled to each of the emitters and a separate output terminal is coupled to each of the collectors. One of the output terminals provides the output signal and the other provides the complement thereof. The second terminals of the two resistors coupled to the collectors are coupled together through a fifth resistor to a voltage power supply. The combination of the fifth resistor and the voltage power supply acts as a relatively constant current source. The common node of the two collector resistors is coupled via the series combination of two diodes to the bases of both transistors. The anode of the first diode is coupled to the common node and the cathode of the second diode is coupled to the bases of the two transistors.

With equal input current signals, or with no input signals, the current from the constant current source divides equally through the two transistors. If one input current signal is increased in value, a corresponding decrease in current flowing through the transistor associated with that input signal occurs and a corresponding increase in the current through the other transistor occurs. The output potential at the collector of the first transistor increases and the output potential at the collector of the second transistor decreases.

In the preferred embodiment, each of the output terminals is coupled to a separate emitter follower transistor. The outputs of these emitter followers are coupled to the input base terminals of a common emitter differential amplifier. An output of the common emitter differential amplifier is coupled to an output stage which uses a totem pole driver circuit coupled to the base of an output transistor. The voltage at the collector of the output transistor serves as the system output. This output voltage TTL compatable output voltage levels.

These features and advantages of the invention will be better understood from a consideration of the following detailed description taken in conjunction with the accompanying drawings.

BRIEF DESCRIPTION OF THE DRAWINGS

FIG. 1 illustrates a detector amplifier circuit in accordance with the present invention; and FIG. 2 illustrates a detector system which utilizes the circuitry of FIG. 1.

DETAILED DESCRIPTION

Referring now to FIG. 1, there is illustrated an embodiment of the present invention which comprises a detector amplifier circuit 10 comprising transistors Q1, Q2, diodes D1 and D2, and resistors R1, R2, R3, R4, R5 and R6.

The first terminal of R2 and an input terminal 12 are coupled to the emitter of Q1. The first terminal of R4 and a second input terminal 14 are coupled to the emitter of Q2. The first terminal of R1 and an output terminal 16 are coupled to the collector of Q1. The first terminal of R3 and an output terminal 18 are coupled to the collector of Q2. The second terminals of R1 and R3 are coupled together to node 20 and the first terminal of R5. The second terminal of R5 is coupled to a voltage power supply VCC.

D1 and D2 are both transistors in which the respective collectors and bases have been coupled together. The anode of D1 (the collector and base of the transistor) is coupled to node 20 and the cathode of D1 (the emitter of the transistor) is coupled to the anode of D2 (the collector and base of the transistor). The cathode of D2 is coupled to node 22, the bases of Q1 and Q2, and to the first terminal of R6. The second terminals of R2, R4 and R6 are all coupled together to a reference potential which is illustrated as ground potential.

Typical values for R1, R2, R3, R4, R5 and R6 and VCC for 600 ohms, 300 ohms, 600 ohms, 300 ohms, 2300 ohms, 5000 ohms and +5 volts, respectively. With no input signal currents applied to 12 and 14, the above parameters result in a current flow through D1 and D2 of approximately 0.2 mA and a current flow through Q1 and Q2 of approximately 0.53 mA each. The total current flow through R5, therefore, is approximately 1.2 mA. The voltages at 12 and 14 are both approximately +0.16 volts each, while the resulting voltages at 16 and 18 are approximately +1.94 volts each.

If relative low but equal values of input signal currents are applied to terminals 12 and 14, there is only a small change in the currents flowing through Q1 and Q2. For example, if input current signals of 0.25 mA each are applied to terminals 12 and 14, the current through Q1 and Q2 drops slightly to approximately 0.5 mA while the current through R2 and R4 increases to 0.75 mA each (0.5 mA from the transistor Q1 or Q2 and 0.25 mA from the input signal). This results in the potential of 12 and 14 being increased by 0.066 volts each to +0.226 volts. The voltages at 16 and 18 increase by approximately 0.08 volts to approximately +2.02 volts each. If the input current signal applied to terminal 12 is now increased to 0.50 mA, the input current signal applied to 14 is held at 0.25 mA, then approximately 0.125 mA shifts from Q1 to Q2. This results in the output voltage differential between 16 and 18 of 150 mv.

An imbalance of input currents results in a current shift such that Q1 or Q2 has greater conduction than the other. The bases of the Q1 and Q2 are coupled through D1 and D2 to node 20. Minor voltage variations at nodes 20 and 22, which are caused by differences in the input signal levels, permit current to switch from one transistor to the other. In contrast, if the bases Q1 and Q2 were held at constant potential, current could not be switched from Q1 to Q2 or from Q2 to Q1.

The response time of the detector amplifier circuit 10 is a function of the input time constant, which is directly proportional to the input impedance. The input impedance of the detector amplifier circuit 10, when utilized with differential current signals, is principally proportional to the dynamic emitter resistance $(KT/a)/Ie$ [ $\sim = (26mv/Ie)$ at room temperature (300°K), where $Ie$ is the emitter current ] of Q1 and Q2. If resistors R1, R3 and R5 are reduced in value, the emitter currents through Q1 and Q2 are appropriately increased and the response time of circuit 10 is thus improved.

If R2 and R4 are decreased in value, applied input signal current levels can be increased and therefore the dynamic range of input signal current levels is thus increased.

The sensitivity of the circuit 10 is, however, inversely proportional to the dynamic range and response time. Accordingly, a trade off exists between response time and dynamic range on one hand, and sensitivity on the other.

Now referring to FIG. 2, there is illustrated a preferred embodiment of a current detector amplifier system 24. System 24 uses the detector amplifier circuit 10, as is illustrated in the dashed line rectangle 26, as an input stage. Terminals 16 and 18 are coupled to the bases of emitter follower transistors Q3 and Q4, respectively. A resistor R7 is coupled between the collector of Q3 and VCC. A resistor R8 is coupled between the emitter of Q3 and ground potential. A resistor R9 is coupled between the collector of Q4 and VCC. A resistor R10 is coupled between the emitter of Q4 and ground potential.

The emitter terminals of Q3 and Q4 are coupled respectively to the bases of transistors Q5 and Q6, which form a common emitter differential amplifier. The collectors of Q5 and Q6 are coupled to VCC through resistors R11 and R12, respectively. Q5 and Q6 are shown as npn Schottky barrier clamped transistors. This type of transistor is the equivalent of a standard transistor in which a Schottky barrier diode is connected between the collector and base in order to prevent the transistor from entering into saturation operation. The emitters of Q5 and Q6 are coupled together to the collector of a transistor Q7. The base of Q7 is coupled to the anode of a diode D7 and to the first terminal of a resistor R13. D7 is an npn transistor in which the collector and base have been coupled together to form the anode and the emitter acts as the cathode. The cathode of D7 is coupled to ground potential. The second terminal of R13 is coupled to the cathode of D8. The anode of D8 is coupled to the cathode of D9. The anode of D9 is coupled to VCC. D8 and D9 are both npn transistors in which the respective collectors and bases have been coupled together such that the transistors serve as diodes. It is to be noted that Q7 contains double emitters which are both coupled to ground potential. The current which flows from VCC through D8, D9, R13 and D7 gives rise to a current through the collector of Q7 which is essentially double that through the three diodes and resistor.

The combination of Q7 and diodes D7, D8, D9 and R13 comprises essentially a constant current source. D7 and D8 are used essentially as temperature compensating diodes.

The output of the common emitter differential amplifier comprising Q5 and Q6 occurs at the collector of Q6 which is denoted as node 28. R12 and R13 are chosen to minimize the effects of finite transistor betas.

Node 28 is connected to the base of a Schottky barrier clamped transistor Q8. The collector of Q8 is coupled through a resistor R14 to VCC and the emitter is coupled to the first terminal of a resistor R15 and the base of a Schottky barrier clamped transistor Q9. The second terminal of R15 is coupled to the first terminal of a resistor R16, the emitter of Q9 and the base of a Schottky barrier clamped transistor Q12. The second terminal of R16 is coupled to ground potential. The collector of Q9 is coupled to the first terminal of a resistor R17, the base of a Schottky barrier clamped transistor Q10, and the anode of a diode D11 which comprises an npn transistor in which the collector and base are coupled together and serve as the anode. The cathode of D11 (the emitter of the transistor) is coupled to an enable terminal and to the cathode of a Schottky barrier diode D10. The anode of D10 is coupled to ground potential.

The second terminal of R17 is coupled to VCC. The emitter of Q10 is coupled to a first terminal of a resistor R18 and the base of a transistor Q11. The second terminal of R18 is coupled to the collector of Q12, the emitter of Q11, a first terminal of a resistor R20, node 30, and the base of a Schottky barrier clamped transistor Q13. The second terminal of R20, as well as the emitters of Q12 and Q13 are all coupled to ground potential. The collector of Q10 is coupled to the collector of Q11 and the first terminal of a resistor R19. The second terminal of R19 is coupled to VCC. The collector of Q13 is coupled to one terminal of a resistor R21 and a system output terminal 32. The second terminal of R21 is coupled to power voltage supply VBB.

Diodes D3, D4, D5 and D6 are all transistors in which the respective collectors and bases are coupled together and serve as the anodes, and the emitters serve as the cathodes. The cathode of D3 and the anode of D4 are coupled to terminal 12 and the anode of D5 and the cathode of D6 are coupled to terminal 14. The anodes of D3 and D6 and the cathodes of D4 and D5 are all coupled to a reference potential which is illustrated as ground potential. D3 and D4 serve to clamp the voltage level of 12 to within approximately the range −0.7 volt to +0.7 volt. D5 and D6 likewise clamp the potential of 14 to within the same voltage range.

Differential input signal current levels applied to input terminals 12 and 14 give rise to differential voltage signals at 16 and 18. If the input current level at 12 is greater than at 14, the output voltage at 16 is greater than that at 18. Conversely, if the input signal level at 12 is less than that at 14, the output at 16 is less than that at 18. These signals appearing at 16 and 18 are coupled to emitter follower transistors Q3 and Q4, respectively. The purpose of Q3 and Q4 is to buffer node 16 and 18, respectively, from the relatively high capacitance associated with Q5 and Q6 due to the Miller capacitance effect.

If the potentials of the bases of Q5 and Q6 are equal, then equal currents flow through each transistor. If the potential of one of the two bases is increased, then current begins to switch into this transistor from the other transistor. If the voltage differential between the two bases is great enough, typically 150 mv, then the transistor having the base at the higher potential is on and the other transistor is completely off. In the case that Q6 is completely on, or almost completely on, Q6 operates in saturation and current flows from Q4 through the Schottky barrier diode anti-saturation clamp associated with Q6 and into the collector terminal of Q6. This current, combined with the current flowing through R12, flows through Q6 and into the collector of Q7. The potential of node 28 drops significantly below +2.1 volts. If the potential at the base of Q6 is significantly lower than the potential of the base of Q5, then there is substantially no conduction through Q6 and node 28 is clamped at approximately +2.1 volts. The potential of node 28 would go to approximately the value of VCC when there is no conduction through Q6 but for the fact that the emitter base junctions Q8, Q9 and Q12, which are serially coupled to node 28, are forward-biased and thereby clamp node 28 to approximately three forward-biased emitter base junction voltages above ground potential (approximately +2.1 volts).

If the input current signal level to 12 is greater than the input current signal level to 14, node 16 becomes more positive in potential than node 18 and consequently the potential of the base of Q5 becomes more positive than the potential of the base of Q6. This causes current to switch from Q6 to Q5. This causes node 28 to be clamped at +2.1 volts.

If the input current signal level to 12 is less than the input current signal level to 14, node 16 becomes less positive in potential than node 18 and consequently the potential of the base of Q5 becomes less positive than the potential of the base of Q6 and current switches from Q5 and Q6. This causes node 28 to be set to a value at least several hundred millivolts below +2.1 volts.

The +2.1 volt level at node 28 is defined as a high level and the other less positive potential appearing at node 28 is defined as a low level.

If a potential of typically +2.4 volts is applied to the enable terminal, D11 is reversed-biased and signals from 28 to the base of Q8 control the operation of Q9, Q10, Q11, Q12 and Q13. If ground potential is applied to the enable terminal, D11 is forward-biased and Q13 is inhibited from turning on. Consequently, the system output at node 32 stays at a high output level which is approximately equal to the value of +VBB independent of what input signals appear at 12 and 14.

If the voltage applied to the enable terminal is at a high level and the voltage at node 28 is at +2.1 volts, which corresponds to a higher current input signal level at node 12 than that at 14, Q8, Q9 and Q12 are biased on and Q10 and Q11 are biased off. This causes the base of Q13 (node 30) to be set to approximately ground potential. Consequently, Q13 is biased off and the potential appearing at the system output terminal 32 is essentially that of the power supply VBB. Typically +VBB is +2.4 volts which is considered a TTL high level.

If the output voltage at node 28 is at least several hundred millivolts lower than +2.1 volts, which corresponds to a lower input signal current level at 12 than at 14, then Q9 and Q12 are biased off and Q10 and Q11 are biased on. The voltage at node 30 assumes a value sufficient to forward-bias the emitter base junction of Q13. This causes conduction through R21 and Q13 which causes the output voltage at 32 to drop to approximately +0.3 volts. Typically this level is considered a TTL low level.

The circuitry of FIG. 2, exclusive of R21, has been fabricated on a single monolithic integrated circuit chip utilizing the following resistor values:

| | |
|---|---|
| R1 = 600 Ω | R11 = 300 Ω |
| R2 = 300 Ω | R12 = 500 Ω |
| R3 = 600 Ω | R13 = 4800Ω |
| R4 = 300 Ω | R14 = 6000Ω |
| R5 = 2300Ω | R15 = 1500Ω |
| R6 = 5000Ω | R16 = 1500Ω |
| R7 = 300 Ω | R17 = 6000Ω |
| R8 = 3000Ω | R18 = 1500Ω |
| R9 = 300 Ω | R19 = 270 Ω |
| R10 = 3000Ω | R20 = 700 Ω |

The potential used for VCC is +5 volts, the value of the external discrete resistor R21 is 50 ohms, and the value of VBB is +2.4 volts. The measured sensitivity of the detector amplifier system of FIG. 2 is 50 microamps or better. This means that if an input signal level of 0.55 milliamps is coupled to terminal 12 and an input signal level of 0.50 milliamps is coupled to terminal 14, that the output node 32 assumes the high level. If the input signal level to 12 is 0.45 milliamps and that to 14 is 0.50 milliamps, the output at node 32 assumes a low level. With 100 pF of load capacitance on inputs 12 and 14 and 50 pF of output load capacitance the measured propagation delay is typically 32 nanoseconds.

The embodiments described herein are intended to be illustrative of the general embodiments of the invention. Various modifications are possible consistent with the spirit of the invention. For example, node 20 of FIG. 1 can be coupled to node 22 in a variety of ways other than by the two diodes illustrated. One example would be a direct connection of nodes 20 and 22 which results in the elimination of the need for D1, D2 and R6. This requires appropriate changes in the values of R1, R3 and R5 and/or the value of VCC be made. Another example is the substitution of a variety of constant current sources for R5 and VCC.

What is claimed is:
1. An amplifier circuit comprising:
   a first switching circuit means having a control terminal and first and second output terminals;
   a second switching circuit means having a control terminal and first and second output terminals, the first output terminals of the first and second switching means serving as separate amplifier circuit output terminals;
   the second output terminals of the first and second switching means serving as amplifier circuit input terminals;
   a first resistor circuit means being coupled to the second output terminal of the first switching means;
   a second resistor circuit means having first and second terminals, the first terminal of the second resistor means being coupled to the first output terminal of the first switching means;
   a third resistor circuit means being coupled to the second output terminal of the second switching means;
   a fourth resistor circuit means having first and second terminals, the first terminal of the fourth resistor means being coupled to the first output terminal of the second switching circuit means;

the second terminals of the first and third resistor circuit means being coupled together, range extender circuit means for increasing the operating range over which the amplifier is useful;

the control terminals of the first and second switching circuit means being coupled together; and circuit means for providing an essentially constant current source, the circuit means being coupled to the second terminals of the first and third resistor means and to the control terminals of the first and second switching means through the range extender circuit means.

2. The apparatus of claim 1 wherein:

the first and second switching circuit means are both junction transistors, the bases, emitters, and collectors of both transistors being the control terminals, the first terminals and the second terminals, respectively; and the first, second, third and fourth resistor circuit means are resistors.

3. The apparatus of claim 2 wherein the essentially constant current source comprises a fifth resistor in series with a voltage source.

4. The apparatus of claim 3 wherein the range extender circuit means comprises two junction diodes.

5. A current detector amplifier system comprising:

a first switching circuit means having a control terminal and first and second output terminals;

a second switching circuit means having a control terminal and first and second output terminals;

the second output terminals of the first and second switching means serving as input terminals;

a first resistor circuit means being coupled to the first terminal of the first switching means;

a second resistor circuit means having first and second terminals, the first terminal of the second resistor means being coupled to the second output terminal of the first switching means;

a third resistor circuit means being coupled to the first terminal of the second switching means;

a fourth resistor circuit means having first and second terminals, the first terminal of the fourth resistor means being coupled to the first terminal of the second switching circuit means;

the second terminals of the first and third resistor circuit means being coupled together;

an essentially constant current circuit means, the constant current means being coupled to the second terminals of the first and third resistor means and to the control terminals of the first and second switching means;

an emitter coupled differential amplifier having at least two input ports and an output port;

the second terminals of the first and second switching means each being coupled to a separate one of the two input ports of the common emitter differential amplifier; and an output voltage amplifier circuit having at least one input port and at least one output port, the output port of the common emitter differential amplifier being coupled to the input port of the output voltage amplifier circuit.

\* \* \* \* \*